(12) United States Patent
Steinlechner et al.

(10) Patent No.: US 9,083,331 B2
(45) Date of Patent: Jul. 14, 2015

(54) DATA INTERFACE HAVING AN INTRINSICALLY SAFE, INTEGRATED ERROR DETECTION

(75) Inventors: Siegbert Steinlechner, Leonberg (DE); Natalja Kehl, Obersulm (DE)

(73) Assignee: ROBERT BOSCH GMBH, Stuttgart (DE)

( * ) Notice: Subject to any disclaimer, the term of this patent is extended or adjusted under 35 U.S.C. 154(b) by 166 days.

(21) Appl. No.: 13/808,231

(22) PCT Filed: Jun. 1, 2011

(86) PCT No.: PCT/EP2011/059078
§ 371 (c)(1),
(2), (4) Date: Mar. 26, 2013

(87) PCT Pub. No.: WO2012/004065
PCT Pub. Date: Jan. 12, 2012

(65) Prior Publication Data
US 2013/0176050 A1   Jul. 11, 2013

(30) Foreign Application Priority Data

Jul. 7, 2010 (DE) .......................... 10 2010 031 030

(51) Int. Cl.
*H03K 19/003* (2006.01)
(52) U.S. Cl.
CPC ........ *H03K 19/003* (2013.01); *H03K 19/00392* (2013.01)
(58) Field of Classification Search
CPC ..................... H03K 19/003; H03K 19/00392
USPC .................................................. 326/9, 10, 14
See application file for complete search history.

(56) References Cited

U.S. PATENT DOCUMENTS

| | | | | |
|---|---|---|---|---|
| 3,559,167 | A | * | 1/1971 | Nieuwland .................... 714/816 |
| 3,585,377 | A | * | 6/1971 | Jessep, Jr. ........................ 714/24 |
| 3,634,665 | A | * | 1/1972 | Carter et al. ................... 714/816 |
| 5,490,155 | A | * | 2/1996 | Abdoo et al. .................. 714/763 |
| 2008/0288844 | A1 | | 11/2008 | Nieuwland |

FOREIGN PATENT DOCUMENTS

| | | |
|---|---|---|
| CN | 1165594 | 11/1997 |
| DE | 103 60 196 | 7/2005 |
| DE | 10 2004 062 825 | 7/2006 |

OTHER PUBLICATIONS

International Search Report for PCT/EP2011/059078, dated Sep. 21, 2011.
Gaitanis N. et al., "An asynchronous totally self-checking two-rail code error indicator", VLSI Test Symposium, 1996, Proceedings of 14$^{th}$ Princeton, NJ, USA, Apr. 28-May 1, 1996, IEEE Copmut. Soc. US, 28, pp. 151-156.

(Continued)

*Primary Examiner* — Don Le
(74) *Attorney, Agent, or Firm* — Kenyon & Kenyon LLP (57) ABSTRACT

An intrinsically safe digital circuit has at least two output signals and at least four input signals for detecting a potential error in the circuit and/or in one of its input signals, the at least four input signals forming two input signal pairs inverted in a double-track manner, and the at least two output signals forming an output signal pair inverted in a double-track manner. The output signal pair transmits a piece of information which is identical to the one of an input signal pair, when the error is not present.

5 Claims, 8 Drawing Sheets

(56) References Cited

OTHER PUBLICATIONS

Al Burress et al., "On-line testable logic design for FPGA-implementation", Proceedings International Test Conference 1997, pp. 471-478.

Parag K. Lala, "Self-Checking and fault tolerant digital design", Academic Press 2001.

* cited by examiner

Fig. 1

| $a_1\ a_0$ | $b_1\ b_0$ | $y_1\ y_0$ |
|---|---|---|
| 0  1 | 0  1 | 1  0 |
| 0  1 | 1  0 | 0  1 |
| 1  0 | 0  1 | 0  1 |
| 1  0 | 1  0 | 1  0 |

$\underbrace{\phantom{a_1\ a_0}}_{a}$ $\underbrace{\phantom{b_1\ b_0}}_{b}$ $\underbrace{\phantom{y_1\ y_0}}_{y}$ — 10

| $a_1\ a_0$ | $b_1\ b_0$ | $y_1\ y_0$ |
|---|---|---|
| 0 1 | 0 1 | 0 1 |
| 0 1 | 1 0 | 0 1 |
| 1 0 | 0 1 | 1 0 |
| 1 0 | 1 0 | 1 0 |

$\underbrace{\qquad}_{60}$

DATA INTERFACE HAVING AN INTRINSICALLY SAFE, INTEGRATED ERROR DETECTION

BACKGROUND OF THE INVENTION

1. Field of the Invention

The present invention is directed to a circuit or a method according to the definition of the species in the independent claims.

The present invention relates to the detection of errors or interferences in digital circuits.

2. Description of the Related Art

Safety-critical applications require circuits which allow a detection of a present permanent or transient error. It is known from Parag K. Lala, "Self-Checking and fault tolerant digital design", Academic Press 2001, that an invertedly doubled circuit is used for this purpose. The outputs of this circuit are identical in the case of error so that an error is signaled for a subsequent circuit. Furthermore, so-called intrinsically safe two-rail checkers are known which use two outputs to signal an error so that a fault is also detected at one of the two intrinsic outputs. In its base form, a conventional two-rail checker has two input signal pairs, each including a signal and its inverted signal, and an output signal pair for error detection. A signal pair is usually referred to as a two-rail signal. A two-rail signal is considered to be valid when its individual signals are not identical in the Boolean sense. Multiple such two-rail checkers may be combined in one circuit to check more than two input signal pairs for errors.

Figure 2:
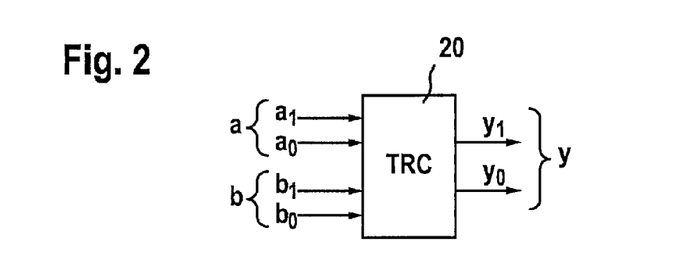
FIG. 2 shows an equivalent circuit diagram for a known two-rail checker which corresponds to the related art.

In FIG. 2, an equivalent circuit diagram of a conventional two-rail checker 20 having a first input two-rail signal a is shown, including an input signal $a_1$ and an input signal $a_0$, and a second input two-rail signal b, including an input signal $b_1$ and an input signal $b_0$, and an output two-rail signal y, including an output signal $y_1$ and an output signal $y_0$.

Figure 1:
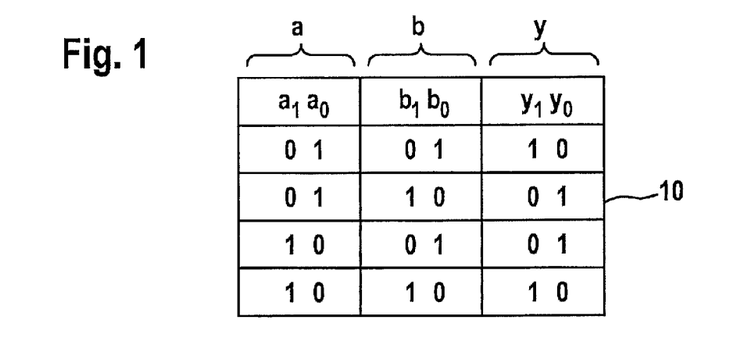
FIG. 1 shows a truth table of a known two-rail checker which corresponds to the related art.

FIG. 1 shows a truth table 10 for a conventional two-rail checker 20. Truth table 10 shows valid output signals $y_0$, $y_1$ for every valid input combination of input signals $a_0$, $a_1$, $b_0$, $b_1$. The combinations illustrated in the truth table represent the error-free case, i.e., valid input signal pairs a, b may be inferred from output signal pair y. An invalid input signal pair leads to an invalid output signal pair which is detected due to its individual output signals $y_0$ and $y_1$ being identical. This means that if output signals show $y_0=1$ and $y_1=0$ or $y_0=0$ and $y_1=1$, an error is not present; if output signals show $y_0=0$ and $y_1=0$ or $y_0=1$ and $y_1=1$, an error is present.

Figure 3:
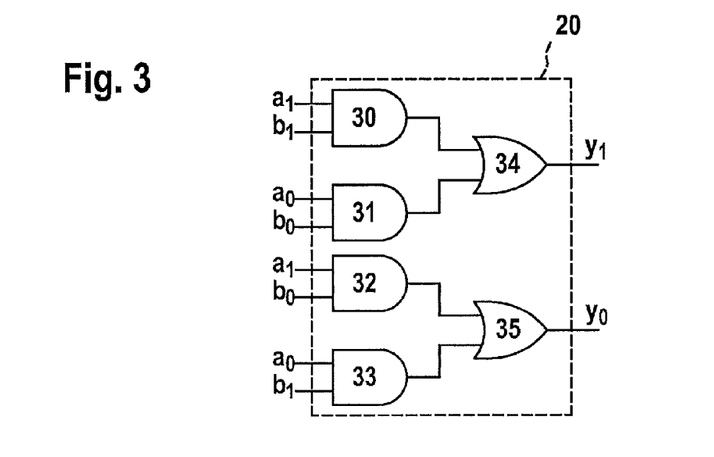
FIG. 3 shows a specific embodiment of a fused circuit for a known two-rail checker which corresponds to the related art.

FIG. 3 represents an implementation of a two-rail checker 20. Two-rail checker 20 includes four AND gates 30, 31, 32, 33 and two OR gates 34 and 35. Based on output signals $y_0$, $y_1$ of a two-rail checker implemented in this way, it may be detected whether input signals $a_0$, $a_1$, $b_0$, $b_1$ are valid as well as whether two-rail checker 20 works in an error-free manner. To ascertain the freedom from defects of two-rail checker 20, a test is to be carried out using the four valid input combinations.

Figure 4:
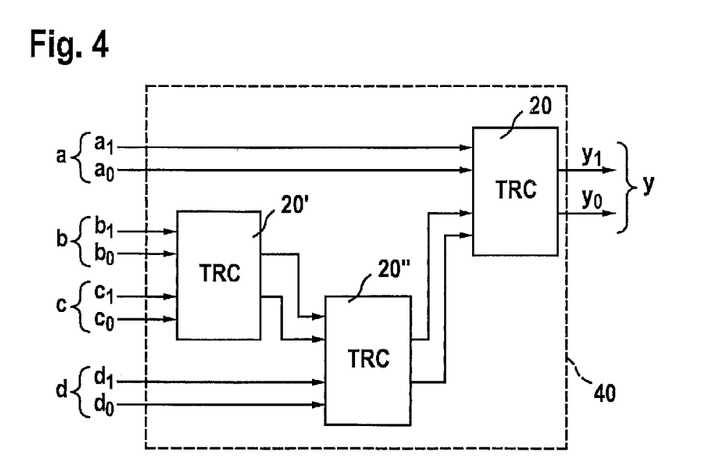
FIG. 4 shows a fused circuit for reducing four two-rail signals to one two-rail signal which corresponds to the related art.

FIG. 4 shows an error checking circuit 40 having four input signal pairs a, b, c, d. For this purpose, three two-rail checkers 20, 20', 20" are interconnected in a cascade and thus combined to form an output signal pair y.

Figure 5:
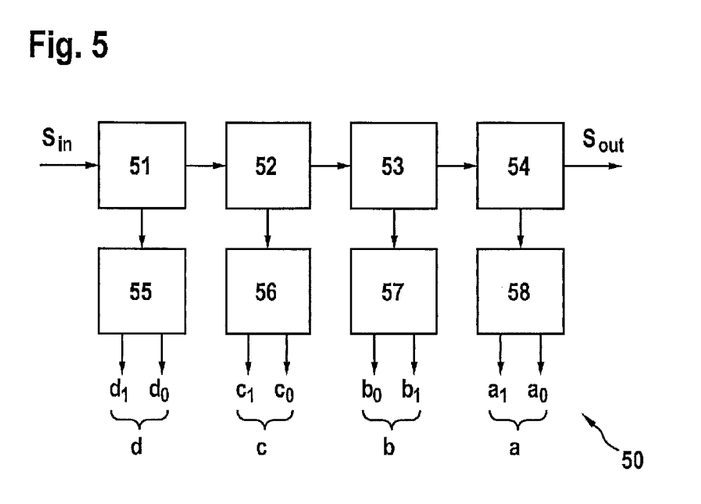
FIG. 5 shows a multi-stage, fused circuit having an error detection at every stage, which corresponds to the related art.

FIG. 5 shows an example of a circuit 50 which includes multiple signal processing blocks 51, 52, 53, 54. An input signal $S_{in}$ is processed in the circuit to yield an output signal $S_{out}$. Each signal processing block 51, 52, 53, 54 is connected to an error detection circuit 55, 56, 57, 58. Each of error detection circuits 55, 56, 57, 58 has an output signal pair d, c, b, a. Output signal pairs d, c, b, a are, in turn, input signal pairs for error checking circuit 40 and are combined to form a single output signal pair y. Output signal pair y shows whether or not an error is present in circuit 50.

BRIEF SUMMARY OF THE INVENTION

The circuit according to the present invention has the advantage over the related art that the intrinsically safe circuit transfers a piece of information of an input signal pair via an output signal pair in addition to its error detection function in the error-free case. This opens up the possibility of fulfilling an additional function with the aid of the circuit for the error check, namely the transmission of a piece of information, simultaneously to the error detection function.

It is particularly preferable when the piece of information carries a parity of one or more of the other output signals. In this way, the subsequent device may additionally check whether an error, which has interfered with the output signals, has occurred behind the monitored circuit.

Advantageously, a circuit which has multiple input signals and/or output signals and in which an error detection is integrated, is constructed in such a way that subcircuits are used which internally have the same design. Such subcircuits may be manufactured cost-effectively using a small number of CMOS transistors.

It is advantageous to use a data interface for the fused circuit, an output signal having a word width of multiple bits, and the output signal pair providing an additional bit in the error-free case.

It is particularly advantageous when the additional piece of information represents the parity of the output signal, which is multiple bits wide, as a 1-bit piece of information, since an error check of a subsequent register is thus made possible in a clocked circuit.

DETAILED DESCRIPTION OF THE INVENTION

Figure 7:
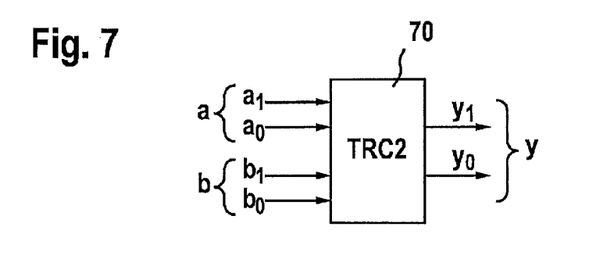
FIG. 7 shows an equivalent circuit diagram for a two-rail checker according to the present invention.

FIG. 7 shows an equivalent circuit diagram of a two-rail checker 70 according to the present invention. Two-rail checker 70 according to the present invention has a first input signal pair a, including a first input signal $a_0$ and a second input signal $a_1$, and an input signal pair b, including a third input signal $b_0$ and a fourth input signal $b_1$, as well as an output signal pair y, including a first output signal $y_0$ and a second output signal $y_1$.

Figure 6:
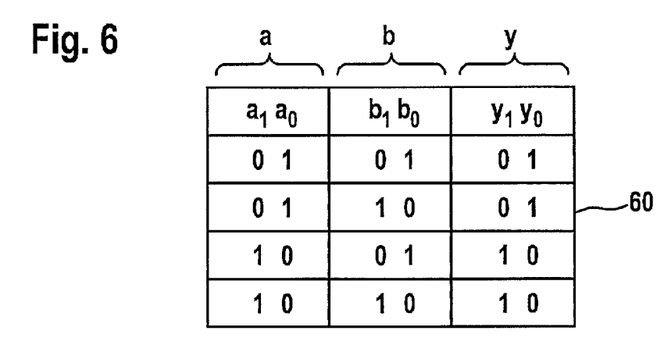
FIG. 6 shows a truth table of a two-rail checker according to the present invention.

FIG. 6 shows a truth table 60 of a two-rail checker 70 according to the present invention for valid, i.e., error-free, cases. The truth table of a two-rail checker according to the present invention shows all valid combinations for an input signal pair a and an input signal pair b and the assignment of output signal pair y. Truth table 60 shows that output signal pair y reproduces input signal pair a. If an error is not present, a piece of information may be transferred to output signal pair y, or to one of its two output signals $y_0$ or $y_1$ via input signal pair a, or one of its two input signals $a_0$ or $a_1$. If, for example, value 0 is requested to be transferred as a piece of information from input signal $a_0$ to output signal $y_0$ using two-rail checker 70 according to the present invention, input signal $a_0$ is set to 0 and input signal $a_1$ is set to 1. In this case, input signal $a_0$ and input signal $a_1$ must differ to yield a valid input signal pair a.

In the case of error, the transferred piece of information is not evaluated, since it is not ensured that the piece of information is valid. The case of error is present when output signal pair y is invalid, i.e., its two output signals $y_0$ and $y_1$ are identical, i.e., $y_0=y_1=1$ or $y_0=y_1=0$. If the case of error is present, the transferred piece of information cannot be used.

Figure 8:
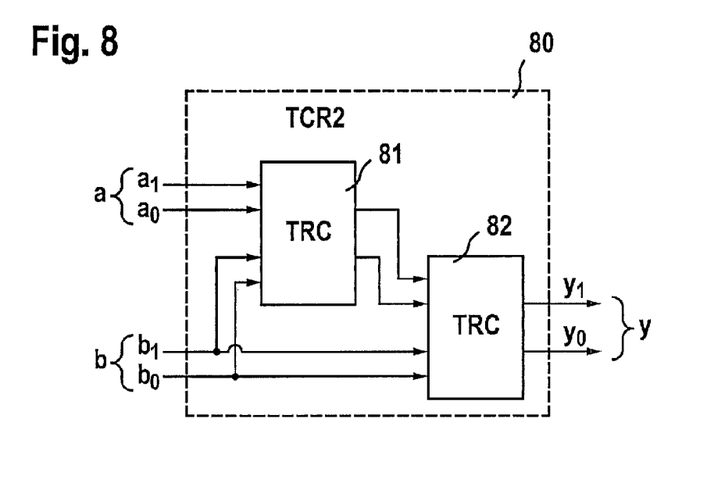
FIGS. 8 through 11 show different specific embodiments of a fused circuit of a two-rail checker according to the present invention.

FIG. 8 shows a specific embodiment of a circuit 80 according to the present invention for a two-rail checker 70 according to the present invention, which may also be used as a subcircuit. Circuit 80 includes two conventional identical two-rail checkers 81, 82, two input signal pairs a, b, and one output signal pair y. The signal inputs and the signal outputs of conventional two-rail checkers 81, 82 are specially interconnected in such a way that, for an assignment of input signal pairs a, b, output signal pair y corresponds to truth table 60 in the error-free case. Circuit 80 for a two-rail checker 70 is intrinsically safe just as a conventional two-rail checker.

Figure 9:
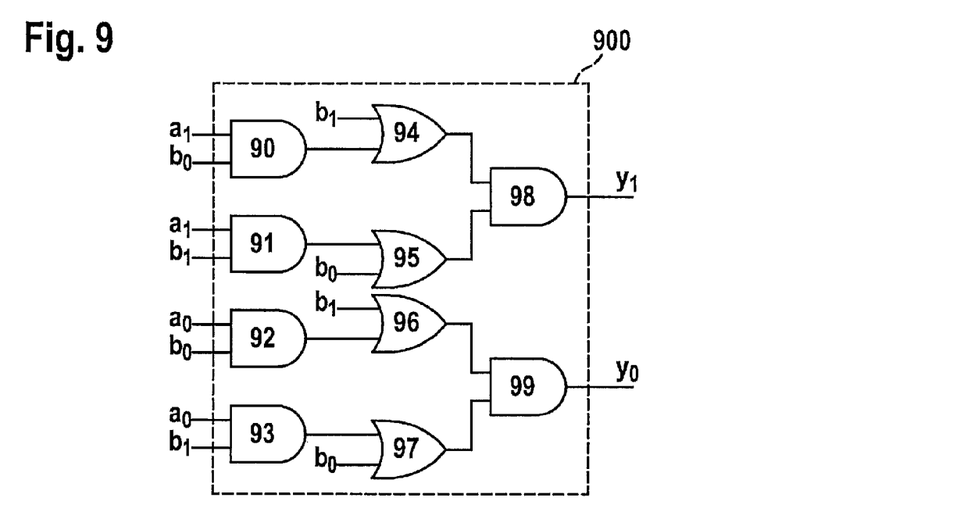

FIG. 9 shows another specific embodiment of an intrinsically safe circuit 900 according to the present invention for a two-rail checker 70 according to the present invention. The circuit includes AND gates 90, 91, 92, 93, 98, 99 and OR gates 94, 95, 96, 97.

Figure 10:
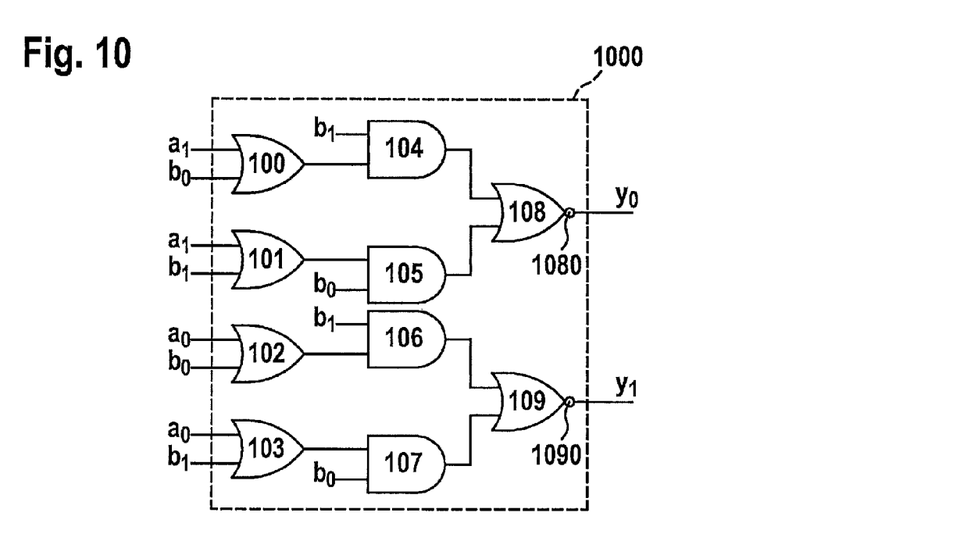

FIG. 10 shows another specific embodiment of an intrinsically safe circuit 1000 according to the present invention for a two-rail checker 70 according to the present invention. The circuit includes AND gates 104, 105, 106, 107, OR gates 100, 101, 102, 103, 108, 109, and inversions 1080, 1090.

Figure 11:
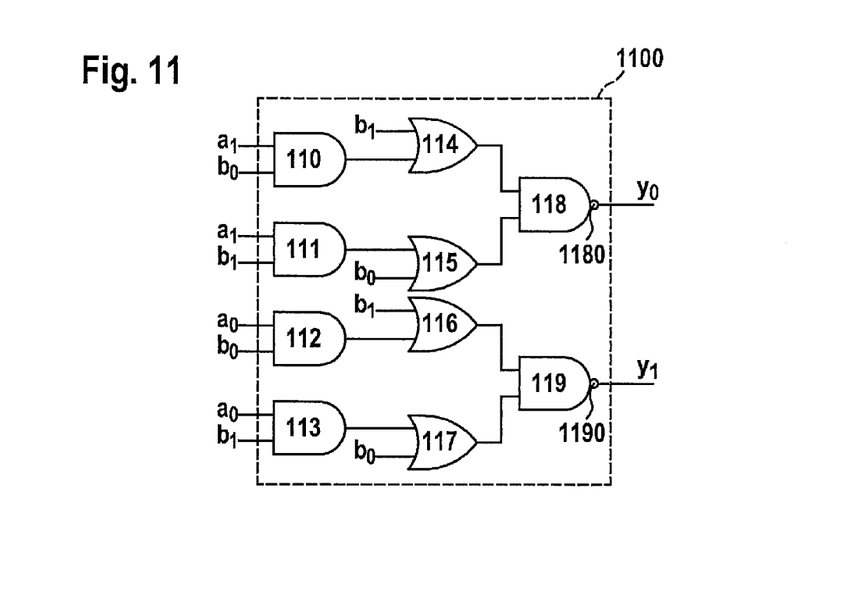

FIG. 11 shows another specific embodiment of an intrinsically safe circuit 1100 according to the present invention for a two-rail checker 70 according to the present invention. The circuit includes AND gates 110, 111, 112, 113, 118, 119, OR gates 114, 115, 116, 117, and inversions 1180, 1190.

Figure 14:
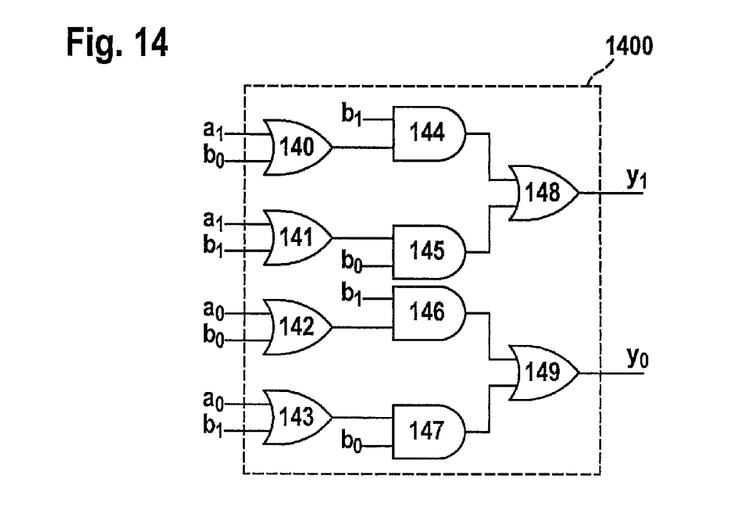
FIGS. 14 through 18 show different specific embodiments of a fused circuit of a two-rail checker according to the present invention.

FIG. 14 shows another specific embodiment of an intrinsically safe circuit 1400 according to the present invention for a two-rail checker 70 according to the present invention. The circuit includes AND gates 144, 145, 146, 147 and OR gates 140, 141, 142, 143, 148, 149.

Figure 15:
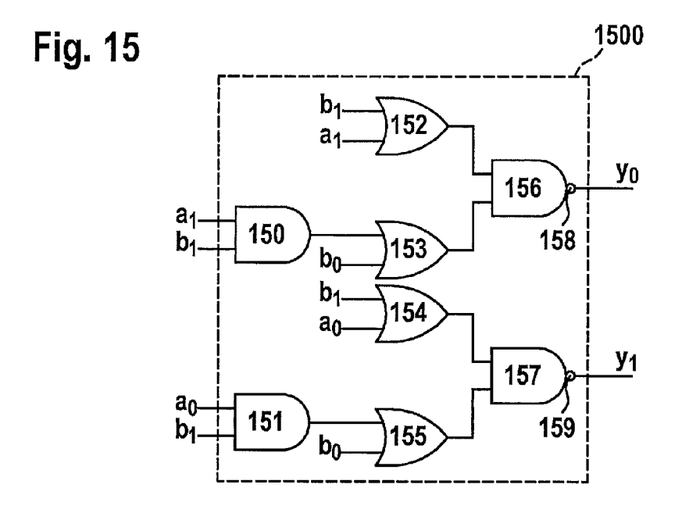

FIG. 15 shows another specific embodiment of an intrinsically safe circuit 1500 according to the present invention for a two-rail checker 70 according to the present invention. The circuit includes AND gates 150, 151, 156, 157, OR gates 152, 153, 154, 155, and inversions 158, 159.

Figure 16:
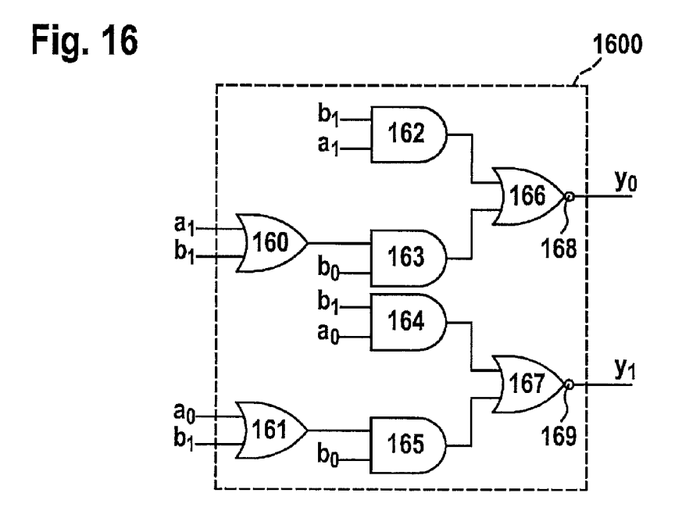

FIG. 16 shows another specific embodiment of an intrinsically safe circuit 1600 according to the present invention for a two-rail checker 70 according to the present invention. The circuit includes AND gates 162, 163, 164, 165, OR gates 160, 161, 166, 167, and inversions 168, 169.

Figure 17:
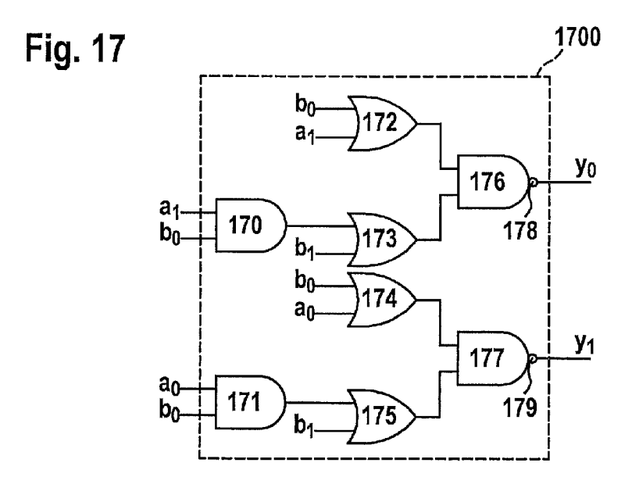

FIG. 17 shows another specific embodiment of an intrinsically safe circuit 1700 according to the present invention for a two-rail checker 70 according to the present invention. The circuit includes AND gates 170, 171, 176, 177, OR gates 172, 173, 174, 175, and inversions 178, 179.

Figure 18:
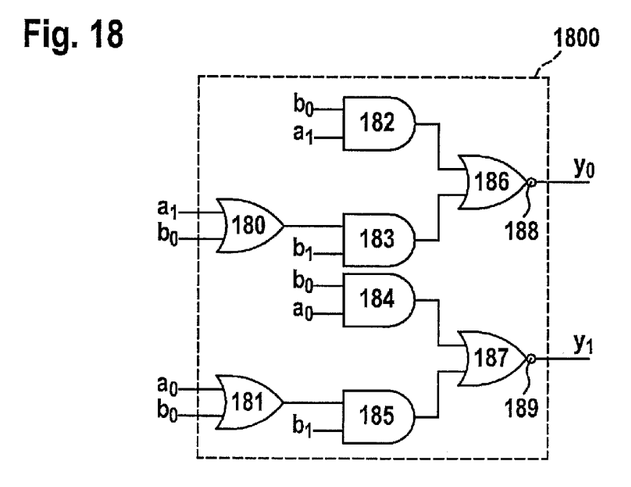

FIG. 18 shows another specific embodiment of an intrinsically safe circuit 1800 according to the present invention for a two-rail checker 70 according to the present invention. The circuit includes AND gates 182, 183, 184, 185, OR gates 180, 181, 186, 187, and inversions 188, 189.

Figure 12:
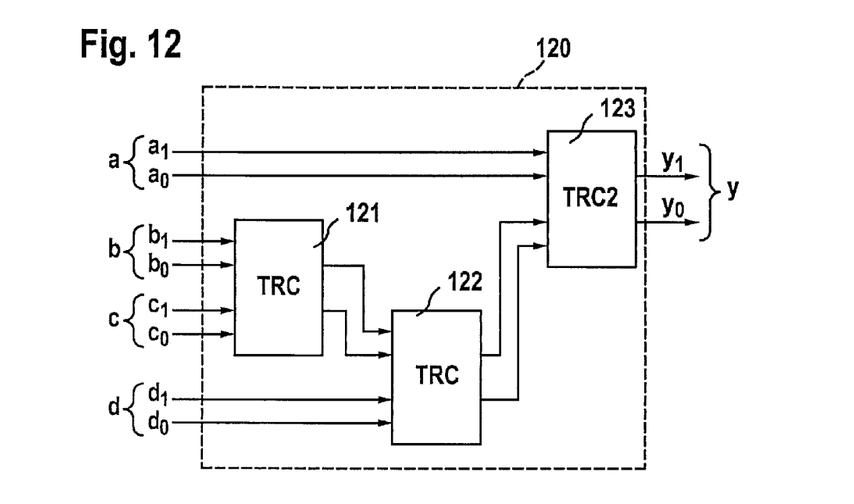
FIG. 12 shows a fused circuit for reducing four two-rail signals to one two-rail signal according to the present invention.

FIG. 12 shows a circuit 120 of a cascade which has two conventional two-rail checkers 121, 122 and one two-rail checker 123 according to the present invention and is used for the error check of four input signal pairs a, b, c, d. In this case, the two-rail checkers are combined in such a way that input signal pair a is transferred as an additional piece of information.

Figure 13:
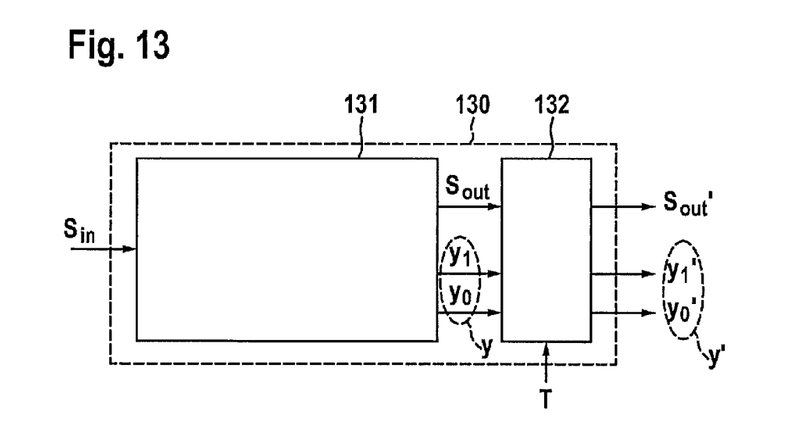
FIG. 13 shows a fused circuit having an output register.

FIG. 13 shows a fused circuit 130. Circuit 130 has a signal processing block 131 and a register 132. An input signal $S_{in}$ is received in signal processing block 131. Input signal $S_{in}$ may include multiple input signals, i.e., it may have an arbitrary word width. The signal processing block has an output signal $S_{out}$ and an output signal pair y. Output signal $S_{out}$ may include multiple output signals, i.e., it may have an arbitrary word width. Output signal pair y includes the two output signals $y_0$ and $y_1$. Output signal $S_{out}$ and output signal pair y lead into register 132. Register 132 has as output signal $S_{out}'$ and output signal pair y'. Output signal $S_{out}'$ may include multiple output signals, i.e., it may have an arbitrary word width. Output signal pair y' includes the two output signals $y_0'$ and $y_1'$. Furthermore, the register is provided with a clock pulse T. Signal processing block 131 uses a two-rail checker according to the present invention.

The transferred piece of information is the parity of output signal $S_{out}$ in the error-free case in output signal pair y. A subsequent circuit is able to evaluate from signal $S_{out}'$ and output signal pair y' whether both signal processing block 131 and register 132, as well as the connections, function in an error-free manner. For this purpose, the subsequent circuit, e.g., a superordinate control unit, initially evaluates whether output signal pair y' indicates an erroneous case. This is used to ascertain whether the signal processing functions properly. The subsequent circuit furthermore determines the parity of output signal $S_{out}'$ and compares the parity to the parity transferred by output signal pair y'. If the two parities are not identical, an error is present in the register or in the transfer.

What is claimed is:

1. An intrinsically safe digital circuit, comprising:
   means for receiving at least four input signals; and
   means for generating at least two output signals;
   wherein the at least four input signals form two input signal pairs inverted in a double-track manner, and the at least two output signals form an output signal pair inverted in a double-track manner, and wherein a potential error in at least one of the digital circuit and the input signals is able to be detected such that the output signal pair transmits an information item which is identical to one of the two input signal pairs when a potential error in at least one of the digital circuit and the input signals is not present.

2. The intrinsically safe digital circuit as recited in claim 1, wherein at least one additional output signal which is not used for error detection is generated, and wherein the information item transmitted by the output signal pair is a parity piece of information of the at least one additional output signal.

3. The intrinsically safe digital circuit as recited in claim 2, wherein:
   the circuit internally has at least one doubled intrinsically safe digital subcircuit inverted in a double-track manner for detecting an error in at least one of (i) a first binary input signal pair including a first input signal and a second input signal, and (ii) a second binary input signal pair including a third input signal and a fourth input signal;

the output signal pair is a binary output signal pair including a first output signal and a second output signal;

the second input signal indicates the inverted first input signal and the fourth input signal indicates the inverted third input signal in the error-free state; and the first output signal is identical to the first input signal, the second output signal is identical to the second input signal, and the second output signal is not identical to the first output signal.

4. The intrinsically safe digital circuit as recited in claim 2, wherein:

the at least one additional output signal has a word width of multiple bits;

an error signal including a first bit and a second bit is generated, an error of a fused circuit being signaled when the first bit of the error signal and the second bit of the error signal are identical, and one of the first bit of the error signal or the second bit of the error signal transmits a 1-bit piece of information from the fused circuit when an error is not being signaled.

5. The intrinsically safe digital circuit as recited in claim 4, wherein the 1-bit piece of information is a parity piece of information of the at least one additional data output.

* * * * *